US010266396B2

(12) United States Patent
Shen et al.

(10) Patent No.: US 10,266,396 B2
(45) Date of Patent: Apr. 23, 2019

(54) MEMS DEVICE WITH ENHANCED SENSING STRUCTURE AND MANUFACTURING METHOD THEREOF

(71) Applicant: TAIWAN SEMICONDUCTOR MANUFACTURING COMPANY LTD., Hsinchu (TW)

(72) Inventors: Ching-Kai Shen, Hsinchu County (TW); Wen-Chuan Tai, Hsinchu (TW); Chia-Ming Hung, Taipei (TW); Hsiang-Fu Chen, Hsinchu County (TW); Jung-Huei Peng, Hsinchu Hsien (TW); Chun-Wen Cheng, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/605,329

(22) Filed: May 25, 2017

(65) Prior Publication Data
US 2018/0339899 A1 Nov. 29, 2018

(51) Int. Cl.
*B81B 7/02* (2006.01)
*B81B 7/00* (2006.01)
*H01L 21/44* (2006.01)
*H01L 21/48* (2006.01)
*H01L 21/50* (2006.01)

(52) U.S. Cl.
CPC .............. *B81B 7/02* (2013.01); *B81B 7/0006* (2013.01); *B81B 7/0009* (2013.01); *H01L 21/44* (2013.01); *H01L 21/48* (2013.01); *H01L 21/50* (2013.01); *B81B 2201/0264* (2013.01); *B81B 2203/033* (2013.01); *B81B 2203/04* (2013.01); *B81B 2203/05* (2013.01)

(58) Field of Classification Search
CPC ......... H01L 21/50; H01L 21/44; H01L 21/48; B81B 7/02; B81B 7/05; B81B 7/04; B81B 7/033
See application file for complete search history.

(56) References Cited

U.S. PATENT DOCUMENTS

| 8,729,646 | B2 * | 5/2014 | Chu | ...................... B81B 3/0059 257/415 |
| 10,150,664 | B2 * | 12/2018 | Chang | ..................... H01L 29/84 |
| 2010/0218613 | A1 * | 9/2010 | Kautzsch | .............. G01L 9/0052 73/724 |
| 2013/0043510 | A1 | 2/2013 | Shu et al. | |

\* cited by examiner

*Primary Examiner* — Kyoung Lee
*Assistant Examiner* — Christina A Sylvia
(74) *Attorney, Agent, or Firm* — WPAT, P.C., Intellectual Property Attorneys; Anthony King

(57) ABSTRACT

The present disclosure provides a semiconductor device, which includes a first substrate comprising an upper surface and a second substrate disposed over the first substrate. The semiconductor device also includes a first electrode disposed in the second substrate and configured to move in a direction substantially parallel to the upper surface in response to a pressure difference, and a second electrode disposed in the second substrate. The second electrode is configured to provide a capacitance in conjunction with the first electrode.

20 Claims, 16 Drawing Sheets

MEMS DEVICE WITH ENHANCED SENSING STRUCTURE AND MANUFACTURING METHOD THEREOF

BACKGROUND

Micro-electro mechanical system (MEMS) devices have been recently developed and are commonly included in electronic equipment. The MEMS device is a micro-sized device, usually in a range from less than 1 micron to several millimeters in size. The MEMS device is fabricated using semiconductive materials to form mechanical and electrical features. The MEMS device may include a number of elements (e.g., stationary or movable elements) for achieving electro-mechanical functionality. MEMS devices are widely used in various applications, such as motion sensors, pressure sensors, printer nozzles, inertial sensors, accelerometers and gyroscopes. Moreover, MEMS applications are extended to optical applications, such as movable mirrors, and radio frequency (RF) applications, such as RF switches or the like.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
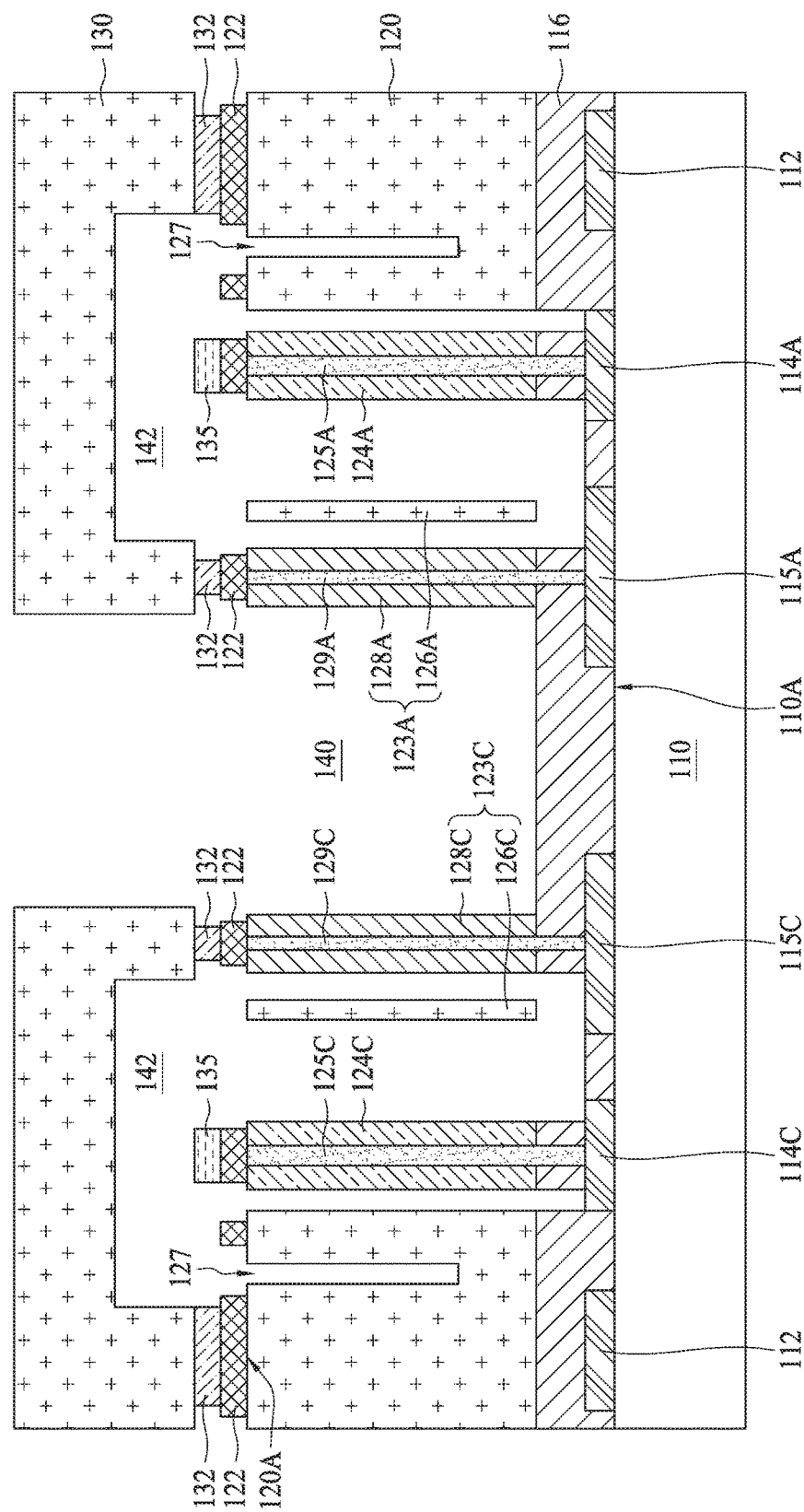
FIGS. 1A and 1B are cross-sectional and top views, respectively, of a MEMS device, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides a semiconductor Micro-electro mechanical system (MEMS) device and its associated manufacturing operations according to various embodiments. Specifically, a MEMS pressure sensor is illustrated as an exemplary application herein. In the MEMS pressure sensor, a typical sensing structure has two sensing electrodes, which face each other and generate a capacitance in proportion to a sensed pressure difference. In the present disclosure, at least one of the sensing electrodes includes several conductive plates arranged in parallel, which are sometimes termed as fingers. In addition, at least one of the electrodes is coupled to a membrane. The membrane is disposed on a substrate vertically and can deflect along a direction horizontally, i.e., along a direction substantially parallel to the direction of the surface of the substrate. The incorporation of the fingers of conductive plates assists in increasing the sensing area of the sensing electrode. Moreover, the proposed composite sensing structure can also provide an improved sensing linearity over existing membrane-type sensors. Furthermore, the vertical membrane can aid in reducing the device footprint and fitting the fingers of conductive plates. Accordingly, the sensing capability of the pressure sensor is enhanced while the manufacturing cost is reduced.

Figure 1B:
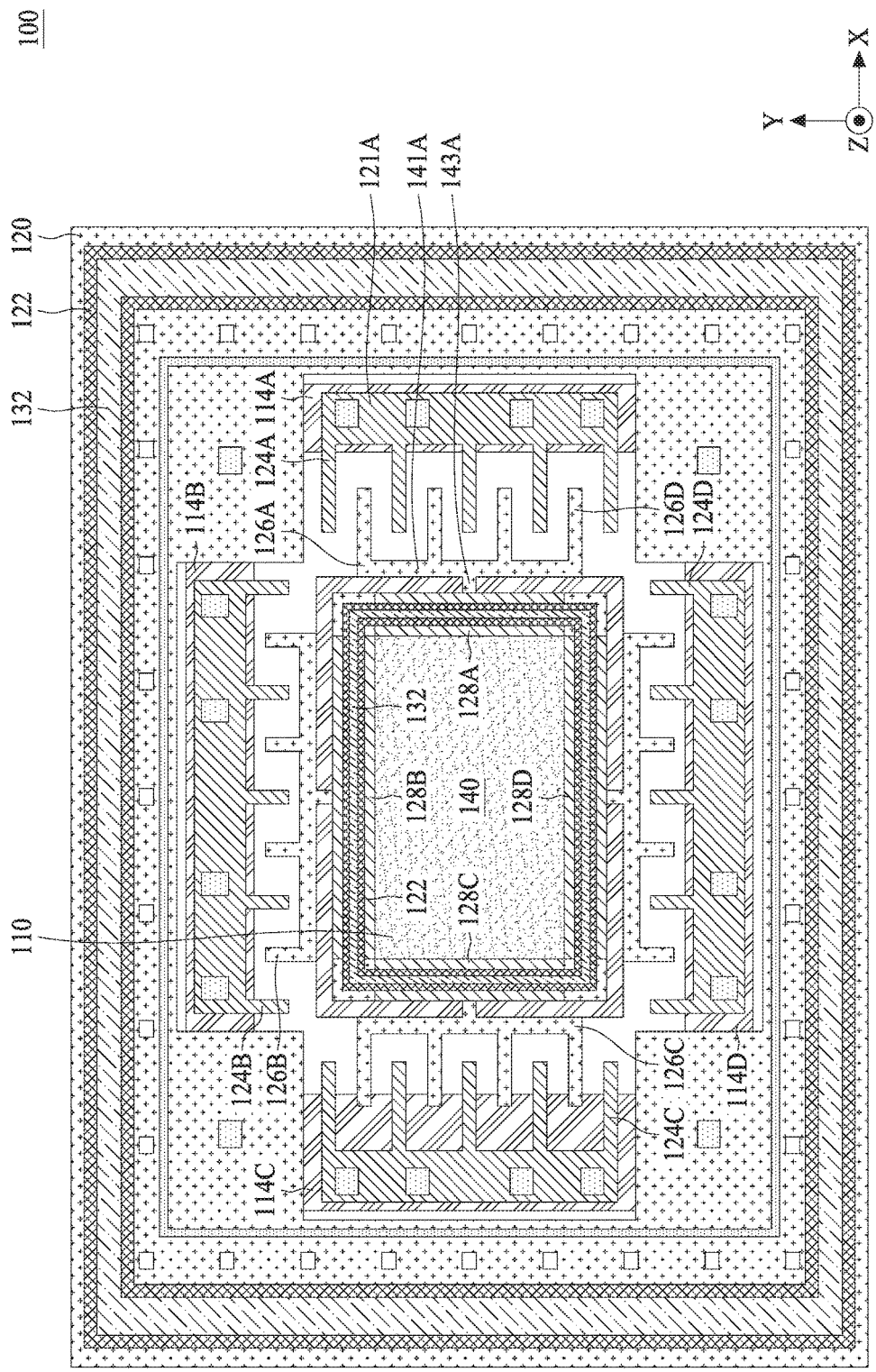

FIGS. 1A and 1B are top and cross-sectional views, respectively, of a MEMS device 100, in accordance with some embodiments. In some embodiments, the MEMS device 100 is sensor, such as a pressure sensor, a motion sensor, an accelerometer, or the like. Referring to FIG. 1A, the MEMS device 100 includes a first substrate 110, a second substrate 120, and a third substrate 130. The first substrate 110 includes a semiconductor material such as silicon. In some embodiments, the first substrate 110 may include other semiconductor materials, such as silicon germanium, silicon carbide, gallium arsenide, or the like. Alternatively, the first substrate 110 includes another elementary semiconductor, such as germanium; a compound semiconductor including gallium arsenic, gallium phosphide, indium phosphide, indium arsenide, or indium antimonide; an alloy semiconductor including SiGe, GaAsP, AlInAs, AlGaAs, GaInAs, GaInP, or GaInAsP; or combinations thereof. In yet another embodiment, the first substrate 110 is a semiconductor-on-insulator (SOI). In other alternatives, the first substrate 110 may include a doped epitaxial layer, a gradient semiconductor layer, or a semiconductor layer overlaying another semiconductor layer of a different type, such as a silicon layer on a silicon germanium layer. The first substrate 110 may be doped with an n-type dopant, such as arsenic, phosphor, or the like, and may be doped with a p-type dopant, such as boron or the like.

In some embodiments, the first substrate 110 includes semiconductor components (not shown) formed on an upper surface 110A. The semiconductor components may include doped regions, conductive features, and dielectric materials. In some embodiments, such semiconductor components are configured to form passive elements, e.g., a capacitor, an inductor, a diode, combinations thereof, or the like. In some embodiments, the components are arranged to form active circuitries such as bipolar junction transistors, field effect transistors, or the like.

In some embodiments, the first substrate 110 may include an interconnect layer (not separately shown) over components of the first substrate 110. The interconnect layer is configured to electrically couple those components in the first substrate 110 with external devices, such as the second substrate 120. In some cases, the interconnect layer redistributes the connection layout between the first substrate 110 and the second substrate 120, and thus is also termed a redistribution layer (RDL). The interconnect layer may include layered conductive lines extending along a horizontal direction where the conductive lines are interconnected through adjacent vertical conductive vias or contacts. The conductive lines and conductive vias/contacts are encapsulated and electrically insulated by a dielectric material or inter-metal dielectric (IMD).

Referring to FIG. 1A, several bond pads 112, 114 and 115 are disposed over the first substrate 110. In some embodiments, the bond pads 112, 114 and 115 are formed in a top layer of the interconnect layer in the first substrate 110. In some embodiments, the bond pads 114 (e.g., bond pads 114A and 114C) are configured to electrically couple the first substrate 110 with electrodes 124. In some embodiments, the bond pads 115 (e.g., bond pads 115A and 115C) are configured to electrically couple the first substrate 110 with electrodes 123 (i.e., respective electrodes 123A and 123C). The bond pads 112, 114 and 115 are formed of conductive materials, such as copper, tungsten, aluminum, silver, gold, combinations thereof, or the like.

In some embodiments, an interface layer 116 is formed over the first substrate 110. In some embodiments, the interface layer 116 couples the first substrate 110 with the second substrate 120. In some embodiments, the interface layer 116 is formed as a top layer of the first substrate 110. In some embodiments, the interface layer 116 covers the bond pads 112. In some embodiments, bond pads 114 and 115 are exposed through the interface layer 116. In some embodiments, the interface layer 116 has recesses (e.g., those situated above the bond pads 114 or 115) on a side facing the second substrate 120. The recesses may expose a portion of the bond pads 114 or 115. The recesses are formed such that some movable features of the second substrate 120 can move freely without contacting the first substrate 110. In some embodiments, the interface layer 116 comprises dielectric materials, such as silicon oxide, silicon nitride, silicon oxynitride, nitrogen-doped oxide, nitrogen-bearing oxide, or the like. In some embodiments, the interface layer 116 includes a polymeric material selected from a group consisting of polyimide (PI), polybenzoxazole (PBO), benzocyclobuten (BCB), epoxy, or the like.

The second substrate 120 is disposed over the first substrate 110. In some embodiments, the first substrate 110 is bonded to the second substrate 120 through the interface layer 116. The second substrate 120 includes a semiconductor material such as silicon or germanium. In some embodiments, the second substrate 120 may include other semiconductor materials, such as silicon germanium, silicon carbide, gallium arsenide, or the like. The second substrate 120 may be formed of a material that is the same as that used in the first substrate 110.

The second substrate 120 includes a sensing structure of the MEMS device 100. The sensing structure is configured to provide a sensing result, in a form of electrical signals, in response to external stimuli, such as atmospheric pressure, temperature, acceleration, or the like. In the present embodiment, the sensing structure is comprised of a pair of electrodes 123 and 124 serving as two spaced electrodes of a capacitor. Moreover, the electrode pair is configured to provide a sensed capacitance in response to a pressure difference. The first electrode 123 may be comprised of a membrane 128 and a conductive plate 126, and the second electrode 124 may be formed of one or more conductive plates. The membrane 128 is substantially perpendicular to the upper surface 110A of the first substrate 110 or the upper surface 120A of the second substrate 120. In the present disclosure, the membrane 128 may include several portions (e.g., 128A through 128D), and the conductive plate 126 or the second electrode 124 may include several portions (e.g., 124A through 124D or 126A through 126D). In the cross-sectional view of FIG. 1A, only some portions (e.g., membranes 128A and 128C) are visible, while remaining portions are illustrated in in FIG. 1B. In the following descriptions, each of the portions of the first electrode 123 and the second electrode 124 can be regarded as a standalone component. Regarding the first electrode 123A (and similarly the first electrode 123C), although FIG. 1A does not depict the membrane 128A as contacting the conductive plate 126A due to the limitations of the cross-sectional view, FIG. 1B shows from a top view that the membrane 128 contacts the conductive plates 126, as will be elaborated in subsequent paragraphs. In some embodiments, the first electrode 123, including the membrane 128 and the conductive plate 126, is movable, while the second electrode 124 may be stationary and fixed on the second substrate 120. Details of the geometry and spatial relationships among the first electrode and the second electrode are provided in descriptions with reference to FIGS. 1B, 2A, 2B, 3A, and 3B.

In some embodiments, each portion of the first electrode 123 (e.g., the portion 128A, 128C, 126A, or 126C) comprises a conductive material, such as copper, tungsten, aluminum, silver, gold, combinations thereof, or the like. In some embodiments, each portion of the first electrode 123 comprises a doped semiconductor material, such as a doped polysilicon material. The dopant for the doped semiconductor material may be phosphor or arsenic for an n-type material or boron for a p-type material.

In some embodiments, a conductive via 129 is disposed within the membrane 128. The conductive via 129 may extend horizontally such that its portions 129A and 129C are connected and electrically coupled to each other through other portions. The conductive via 129A or 129C may have a height substantially equal to the height of the second substrate 120 in order to electrically couple with the first substrate 110 or the third substrate 130. In some embodiments, a top surface of the conductive via 129A or 129C is exposed through the membrane 128A or 128C. In some embodiments, the conductive via 129A or 129C electrically couples to the corresponding bond pad 115A or 115C. The conductive vias 129A and 129C may be formed of a conductive material, such as copper, tungsten, aluminum, silver, gold, combinations thereof, or the like.

In some embodiments, a conductive via 125 is disposed within the second electrode 124. The conductive via 125 may extend horizontally such that its portions 125A and 125C are connected and electrically coupled to each other through other portions. The conductive via 125A or 125C may have a height substantially equal to the height of the second substrate 120 in order to electrically couple with the first substrate 110 or the third substrate 130. In some embodiments, a top surface of the conductive via 125A or 125C is exposed through the second electrode 124. In some embodiments, the conductive via 125A or 125C electrically couples to the corresponding bond pad 114A or 114C. The conductive vias 125A and 125C may be formed of a conductive material, such as copper, tungsten, aluminum, silver, gold, combinations thereof, or the like.

A bonding layer 122 is disposed over the second substrate 120. The bonding layer 122 is a patterned layer wherein bond pads are formed on the top surface of the second substrate 120 through a patterning operation. The bonding layer 122 may be formed of a conductive material, such as copper, tungsten, aluminum, silver, gold, combinations thereof, or the like. Another bonding layer 132 on the third substrate 130 is disposed over the bonding layer 122. The bonding layer 122 or 132 may be formed of a conductive material, such as germanium, copper, tungsten, aluminum, silver, gold, combinations thereof, or the like. In some embodiments, eutectic bonding is utilized to bond the second substrate 120 and the third substrate 130 through bonding layers 122 and 132 where the materials selected for the bonding layers 122 and 132 may be AlCu and germanium, respectively.

A protection layer 135 is disposed on the bonding layer 122. The protection layer 129 is patterned in such a way as to cover only portions of the bonding layer 122 that are not bonded with the bonding layer 132 of the third substrate 130. In some embodiments, the protection layer 135 is formed on the bonding layer 122 at locations directly over the second electrode 124 (e.g., 124A and 124C). In some embodiments, the protection layer 135 is patterned following the pattern of the second electrode 124. In some embodiments, the protection layer 135 has a circular shape or a polygonal shape viewed from above. The protection layer 135 may be comprised of ceramic material, such as titanium nitride, titanium diboride, zirconium diboride, combinations thereof, or the like.

The third substrate 130 is disposed over the second substrate 120. In some embodiments, the third substrate 130 is bonded to the second substrate 120 through bonding layers 132. The third substrate 130 includes a semiconductor material such as silicon or germanium. In some embodiments, the third substrate 130 may include other semiconductor materials, such as silicon germanium, silicon carbide, gallium arsenide, or the like. The third substrate 130 may be formed of a material that is the same as that used in the first substrate 110 or second substrate 130. The third substrate 130 may comprise a recess facing the second substrate 120. The recesses may be used for forming cavities accommodating the first electrode 123 and the second electrode 124.

A cavity 140 is formed by the first substrate 110 (or the interface 116), the membrane 128 and the third substrate 130. The cavity 140 includes an opening formed in the third substrate 130 and is exposed to the atmosphere through the opening. Another cavity 142 is formed by the first substrate 110, the second substrate 120 and the third substrate 130. Specifically, the cavity 142 is laterally surrounded by the second substrate 120 and the membrane 128. The cavity 142 accommodates the conductive plate 126 of the first electrode 123 and the second electrode 124. The cavity 142 may have a circular or polygonal shape and may accommodate each portion of the conductive plates 126 of the first electrode 123 and the second electrode 124, such as portions 124A, 124C, 126A and 126C. Moreover, the conductive plate 126 has a first free end adjacent to the third substrate 130 and a second free end adjacent to the recesses on the first substrate 110. The membrane 128 and the conductive plate 126 of the first electrode 123 are configured to move in spaces of the cavity 142. In some embodiments, in contrast to the cavity 140, the cavity 142 is a closed cavity and substantially a vacuum or a partial vacuum. In some embodiments, the cavity 142 is kept at a pressure of less than about 0.01 torr. The pressure difference between the cavities 140 and 142 causes the membrane 128 to deflect toward the cavity 142. The deflection of the membrane 128 drives the shifting of the conductive plate 126 toward the second electrode 124.

In some embodiments, a trench 127 is formed in the second substrate 120. The trench 127 may be exposed on the upper surface 120A of the second substrate 120. The trench 127 may be disposed adjacent to the locations where bonding layers 122 and 132 are bonded. In some embodiments, the trench 127 is disposed between a bond pad of the bonding layer 132 and the second electrode 124. In some embodiments, the trench 127 may surround the second electrode 124. In some embodiments, the trench 127 may have a circular or polygonal shape viewed from above. When the third substrate 130 is pressed against and bonded with the second substrate 120, the bonding layers 122 and 132 are pressed for performing bonding. The trench 127 is utilized for draining excess bonding materials of the bonding layer 122 or 123 during the operation of bonding. Therefore, the conductive material of the bonding layers 122 and 132 will be prevented from contacting the second electrode 124. Undesired short circuit effects can thereby be avoided.

FIG. 1B is a top view of the MEMS device 100, in accordance with some embodiments. Referring to FIGS. 1A and 1B, some features are omitted in either FIG. 1A or 1B. For example, the third substrate 130 and protection layer 135 are not shown in FIG. 1B so that the remaining elements can be illustrated more clearly. In the present embodiment, the first membrane 128 has a quadrilateral shape, such as a rectangle or a square, comprised of four portions 128A, 128B, 128C and 128D, wherein each portion can be regarded as a standalone membrane 128. Similarly, the conductive plate 126 of the first electrode 123 has four portions 126A, 126B, 126C and 126D, wherein each portion can be regarded as a standalone conductive plate 126 of the first electrode 123. Moreover, the second electrode 124 has four portions 124A, 124B, 124C and 124D, wherein each portion can be regarded as a standalone second electrode 124. In some embodiments, the portions 128A through 128D are electrically coupled to one another and configured to perform sensing as an integrated membrane. In some embodiments, the portions 126A through 126D are electrically coupled to one another and configured to perform sensing as an integrated sensing plate. In some embodiments, the portions 124A through 124D are electrically coupled to one another and configured to perform sensing as an integrated sensing plate. In some embodiments, the cavity 140 is laterally surrounded by the membrane 128, i.e., the four portions 128A through 128D. In some embodiments, the second electrode 124 surrounds the first electrode 123 (including the membrane 128 and the conductive plate 126). In some embodiments, the cavities 140 and 142 are separated by the membrane 128. During operation of a pressure sensing, the membrane 128 deflects toward the cavity 142 along the four directions in the x-y plane at its four portions.

The conductive plate 126 of the first electrode 123 or the second electrode 124 may be comprised of several plates (fingers) extending along a direction substantially parallel to the x-axis, i.e., along the upper surface of the second substrate 120 or the upper surface of the first substrate 110. Each set of fingers in the portions, e.g., 124A or 126A, are connected through a respective arm, e.g., 121A or 141A, arranged perpendicular to the direction in which the fingers extend (i.e., along the y-axis). In some embodiments, the arm 121A or 141A has a material that is the same as that used for the fingers connected thereto.

Still referring to FIG. 1B, the bonding layers 122 and 132 are patterned as concentric bonding rings. The inner bonding rim of the bonding layer 122 or 132 has a pattern substantially following the shape of the membrane 128. In some embodiments, the bonding rim of the bonding layer 122 or 132 has a quadrilateral shape or polygonal shape. The outer bonding rim of the bonding layer 122 or 132 is disposed at a periphery of the MEMS device 100. In some embodiments, the outer bonding rim of the bonding layer 122 or 132 surrounds the sensing structure of the MEMS device 100. The inner (or outer) bonding rim 132 is disposed directly over the corresponding inner (or outer) bonding rim 122. In some embodiments, the bonding rims 122 or 132 may be patterned into different shapes and are generally termed bond pads 122 or 132.

In the first electrode 123, each portion of the membrane 128 is coupled to a respective conductive plate 126 through a connecting portion 143, such as 143A. In some embodiments, the number of connecting portions 143 is equal to the number of portions of the membrane 128 or the number of portions of the conductive plate 126, such as four. The connecting portion 143 may have a height substantially equal to the height of the membrane 128 or the height of the conductive plate 126. In some embodiments, there is no bonding layer 122 or 132 above the connecting portion 143, as illustrated in FIG. 1B.

Figure 2A:
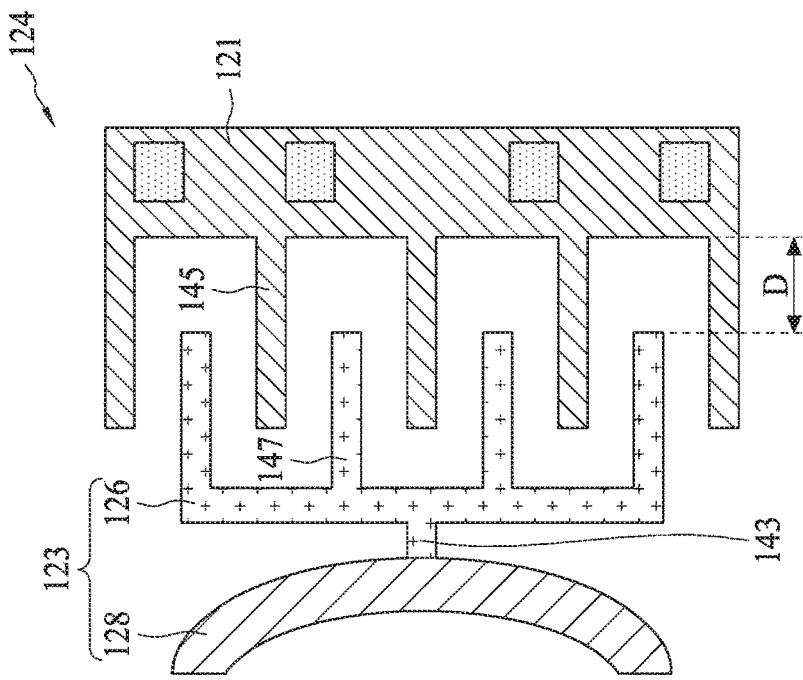
FIGS. 2A and 2B are schematic views of a sensing structure of the MEMS device in FIG. 1A, in accordance with some embodiments.
Figure 2B:
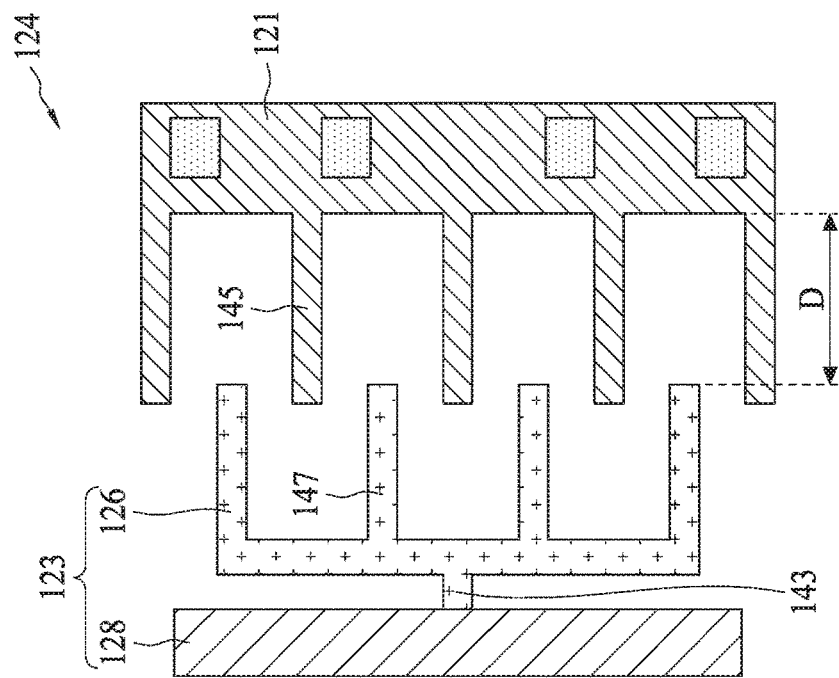

FIGS. 2A and 2B are schematic views of the sensing structure of the MEMS device 100 in FIG. 1A, in accordance with some embodiments. The conductive plates 126 and the second electrode 124 face each other with staggered fingers 145 and 147, respectively. In addition, the fingers 147 of the conductive plate 126 or the fingers 145 of the second electrode 124 are arranged substantially in parallel. The fingers 145 of the second electrode 124 are parallel with the fingers 147 of the conductive plate 126 for each of the four portions. Referring to FIG. 2A, when no pressure difference exists, a gap D between the fingers 147 of the conductive plate 126 and the arm 121 of the second electrode 124 is predetermined given that the membrane is kept straight. Referring to FIG. 2B, the membrane 128 is deflected from the cavity 140 toward the cavity 142 by a pressure difference. Therefore, the gap D is reduced in a sensing operation where the first electrode 123 deflects closer to the second electrode 124 without contact between the two conductive plates. The gap D may be different for varying pressure differences, resulting in various effective coupling areas between the fingers of the second electrode 124 and the conductive plate 126. An effective sensing capacitance is induced by the capacitive effect between the conductive plate 126 and the second electrode 124.

Existing pressure sensors are configured to provide a sensing capacitance through the capacitive coupling between a membrane and the conductive plate. The membrane is typically arranged parallel to the first substrate 110. Thus, the membrane deflects vertically in response to a pressure difference above and below the membrane. Additionally, since the deflected membrane 128 is curved, the capacitance between the membrane 128 and the conductive plate 126 may not be equal at every location. For example, the capacitance induced by the middle portion of the membrane is greater than that induced by the periphery portion. The non-linear capacitance distribution poses challenges to designers for determining the curvature of the membrane and for mapping the sensed capacitance values to the actual pressure values. In contrast, the proposed sensing structure adopts a vertical membrane. The sensing area of the membrane is significantly increased compared to existing methods in terms of a same area of an ambient-pressure cavity (e.g., cavity 140). The footprint of the MEMS device can be further reduced. Moreover, the membrane is connected to a finger-type plate for performing inter-plate coupling. The capacitive coupling of a non-linear variation from the deflected membrane is thus transformed into a coupling of linear variation between two fingers. Therefore, the capacitive coupling with finger-type conductive plates (e.g., fingers 145 and 147) assists in enhancing the effective coupling area as well as the sensing linearity. The sensitivity and accuracy of the sensing operation are improved accordingly.

Figure 3B:
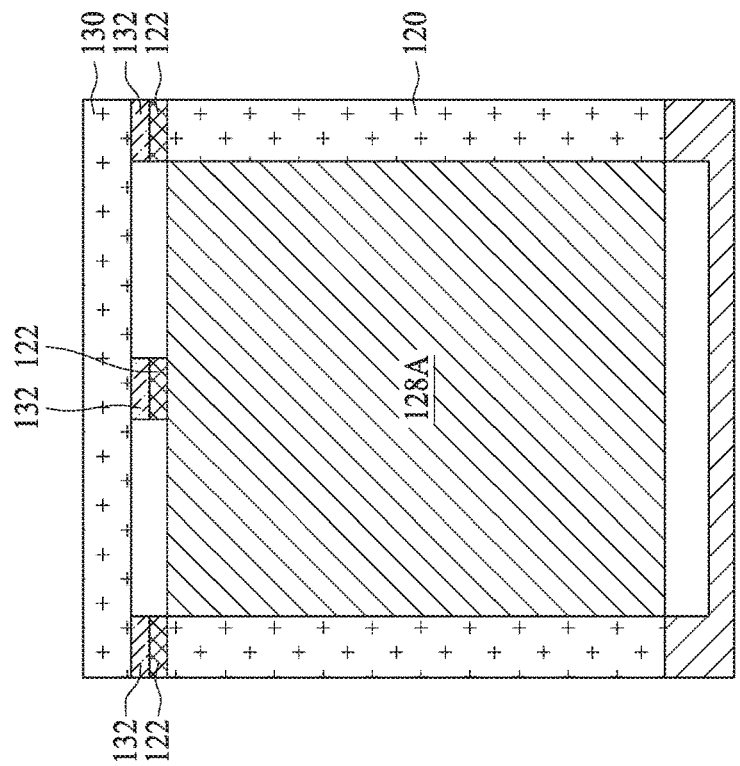
FIGS. 3A and 3B are schematic views of a movable membrane of the MEMS device in FIG. 1A, in accordance with some embodiments.
Figure 3A:
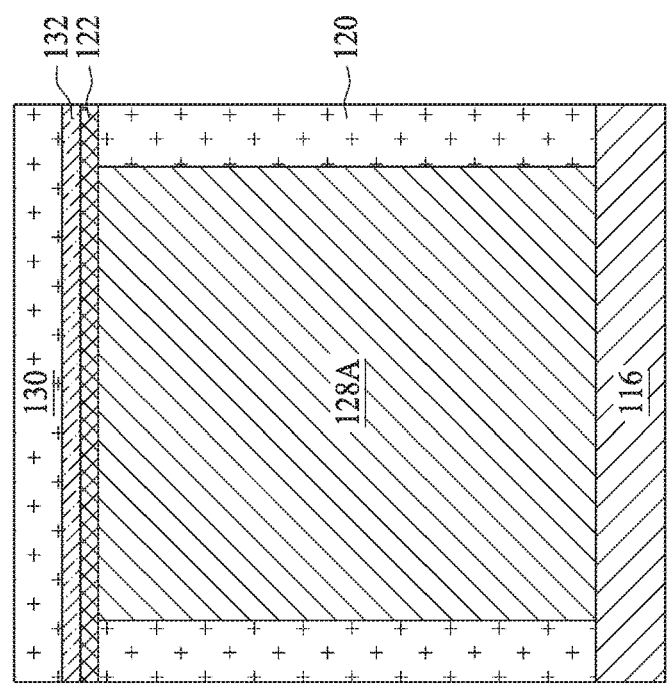

FIGS. 3A and 3B are schematic views of membrane 128 of the MEMS device 100 in FIG. 1A, in accordance with some embodiments. In FIGS. 3A and 3B, only a single portion of the membrane 128, such as 128A, is illustrated, but this can represent any other portion of the membrane 128. As discussed previously, each portion of the membrane 128 may be electrically coupled to other portions at two sides. In such case, the membrane 128A is comprised of a single conductive material (such as doped silicon) at the connecting sides. Referring to FIG. 3A, the membrane 128A is separated from neighboring portions, e.g., 128B or 128D, by the second substrate 120. The second substrate 120 disposed on two sides of the membrane 128A electrically isolates the membrane 128A from other portions of the membrane 128. Furthermore, the membrane 128A is coupled to the bonding layer 122 and the first substrate 110 at its upper side and bottom side, respectively. The deflection of the membrane 128A may be largest around the center.

Referring to FIG. 3B, in some embodiments, the membrane 128A is coupled to the third substrate 130 only at two upper corners. The bonding layers 122 and 132 are patterned as bond pads accordingly. In other words, the bonding layers 122 and 132 are patterned to include at least one recess 133 and pond pads (also called 122 or 123) surrounding the recess 133. The space between the third substrate 130 and the membrane 128A allows for more flexibility around the upper side of the membrane 128A for being deflected. Also, the membrane 128A may be coupled to the third substrate 130 through bond pads 122 and 132 disposed at a central location of the upper side. The configurations of bond pads 122 or 132, such as the number and shape, may be different depending on applications and are not limited to the embodiments herein. Furthermore, the membrane 128A is coupled to the first substrate 110 only at two lower corners. A recess 117 in the interface layer 116, which faces the membrane 130, allows for more flexibility around the lower side of the membrane 128A for being deflected.

Figure 4A:
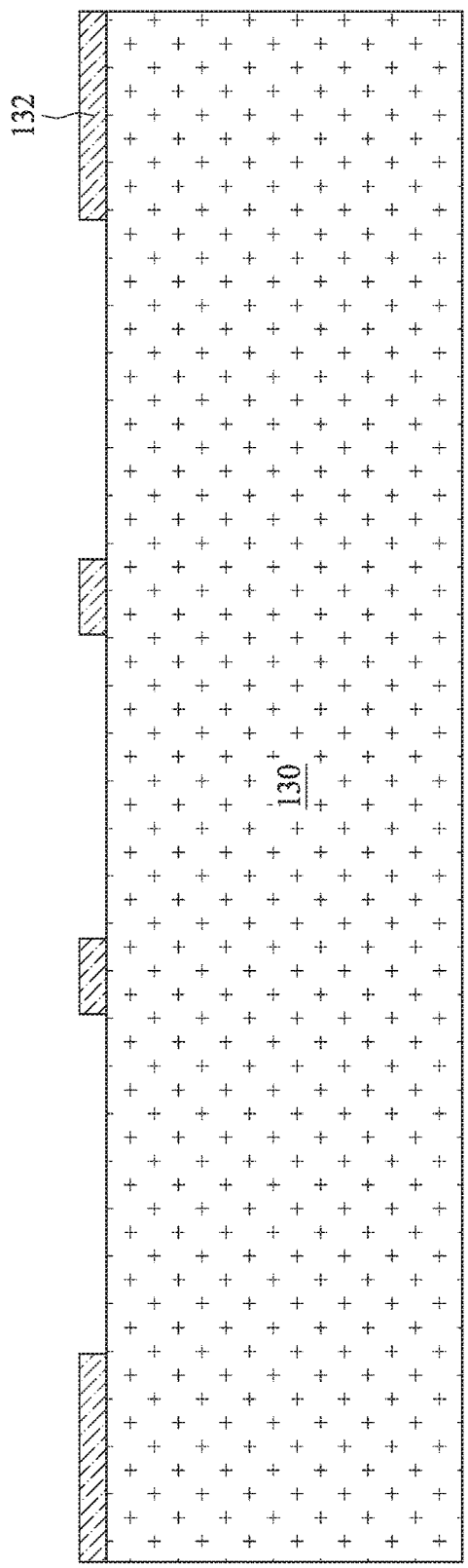
FIGS. 4A through 4C are cross-sectional views of intermediate structures for a method of manufacturing a MEMS device, in accordance with some embodiments.
Figure 4B:
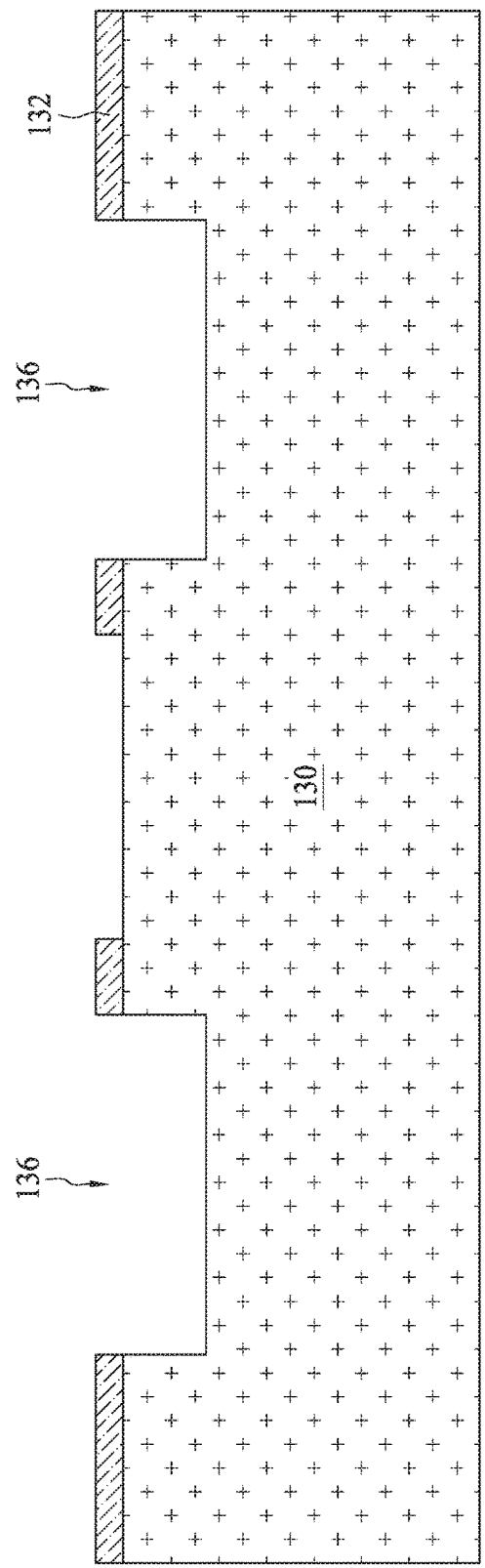
Figure 4C:
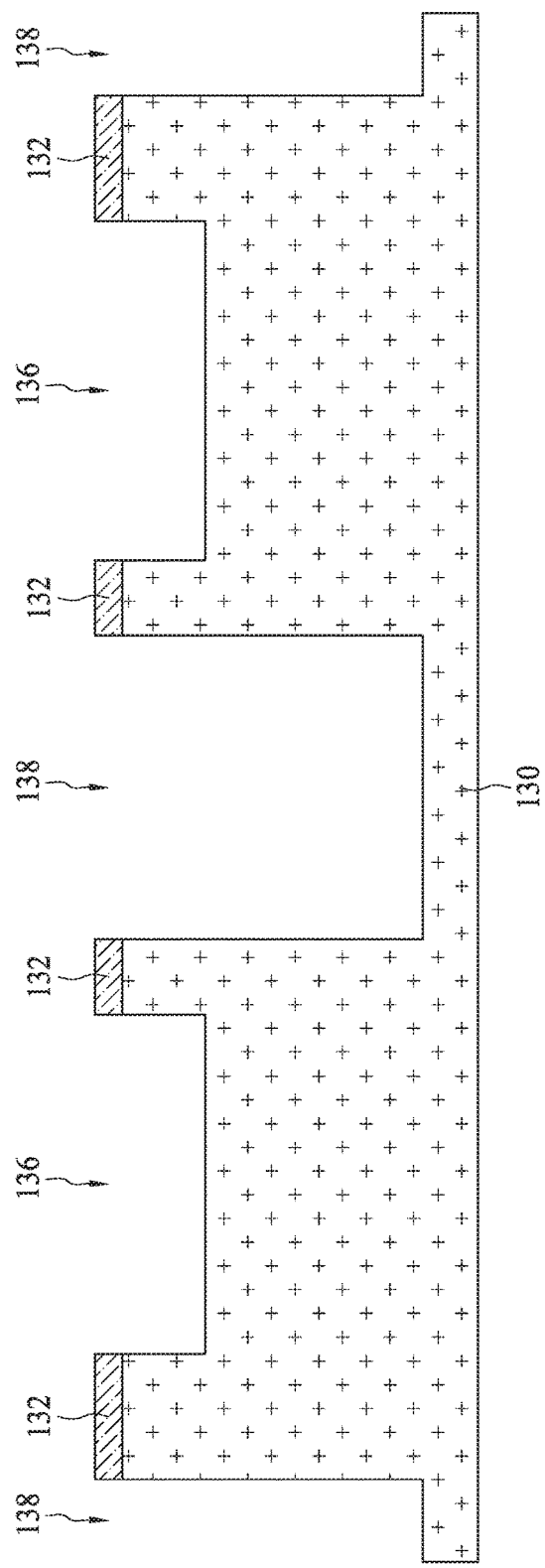

FIGS. 4A through 4C are cross-sectional views of intermediate structures for a method of manufacturing the MEMS device 100, in accordance with some embodiments. Referring to FIG. 4A, a semiconductor substrate is provided or received serving as a third substrate 130. A bonding layer 132 is formed over the third substrate 130. The bonding layer 132 is formed by initially depositing a conductive material over the third substrate 130, followed by a lithographic process for patterning the conductive material into bonding rims or bond pads. The deposition of the bonding layer 132 can be carried out using any of a variety of techniques, including chemical vapor deposition (CVD), LPCVD (low-pressure CVD), PECVD (plasma-enhanced CVD), physical vapor deposition (PVD), sputtering, or the like.

FIG. 4B illustrates the formation of recesses 136. In some embodiments, a photoresist (not shown) is patterned over the third bonding layer 132 and serves as a masking layer. An etching operation is performed to recess the third substrate 130 among bond pads of the bonding layer 132. The etching operation may include a dry etching, a wet etching, or a reactive ionic etching (RIE) operation. The photoresist is stripped after the recesses 136 are formed.

Referring to FIG. 4C, recesses 138 are formed on the third substrate 130. The methods for forming the recesses 138 may be similar to those used in forming the recesses 136. The recesses 138 may be situated at a periphery of the third substrate 130. In some embodiments, each of the recesses 138 has a depth greater than each of the recesses 136.

Figure 5A:
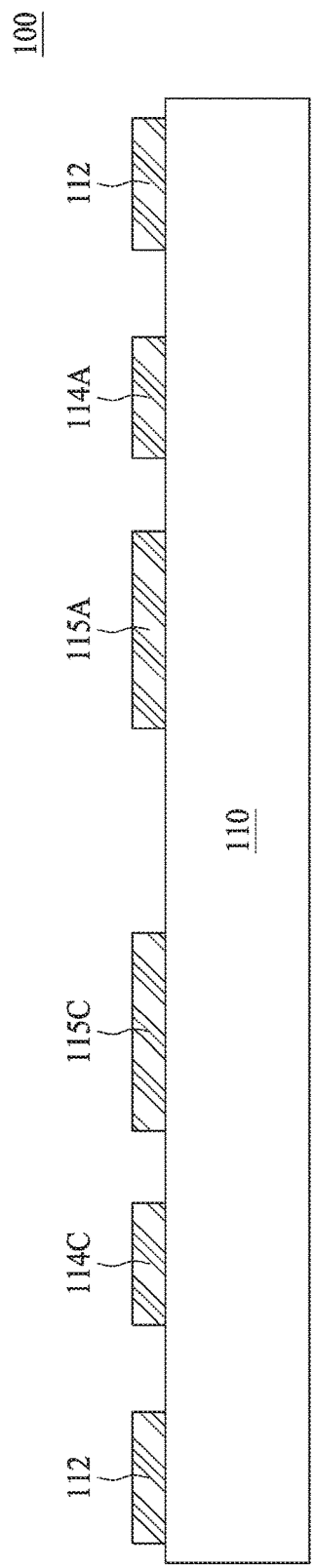
FIGS. 5A through 5I are cross-sectional views of intermediate structures for a method of manufacturing a MEMS device, in accordance with some embodiments.

FIGS. 5A through 5I are cross-sectional views of intermediate structures for a method of manufacturing the MEMS device 100, in accordance with some embodiments. FIG. 5A shows the formation of a conductive layer over the first substrate 110, where the conductive layer is patterned and includes bond pads 112, 114, and 115. The manufacturing methods of the bond pads 112, 114, and 115 may be similar to that of the bonding layer 132.

Figure 5B:
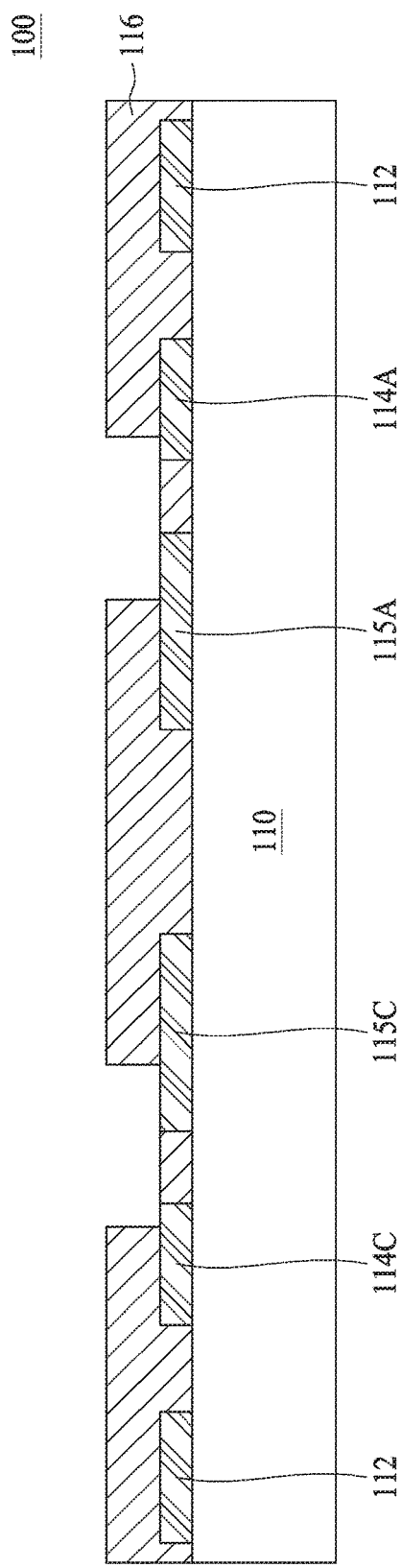
Figure 5C:
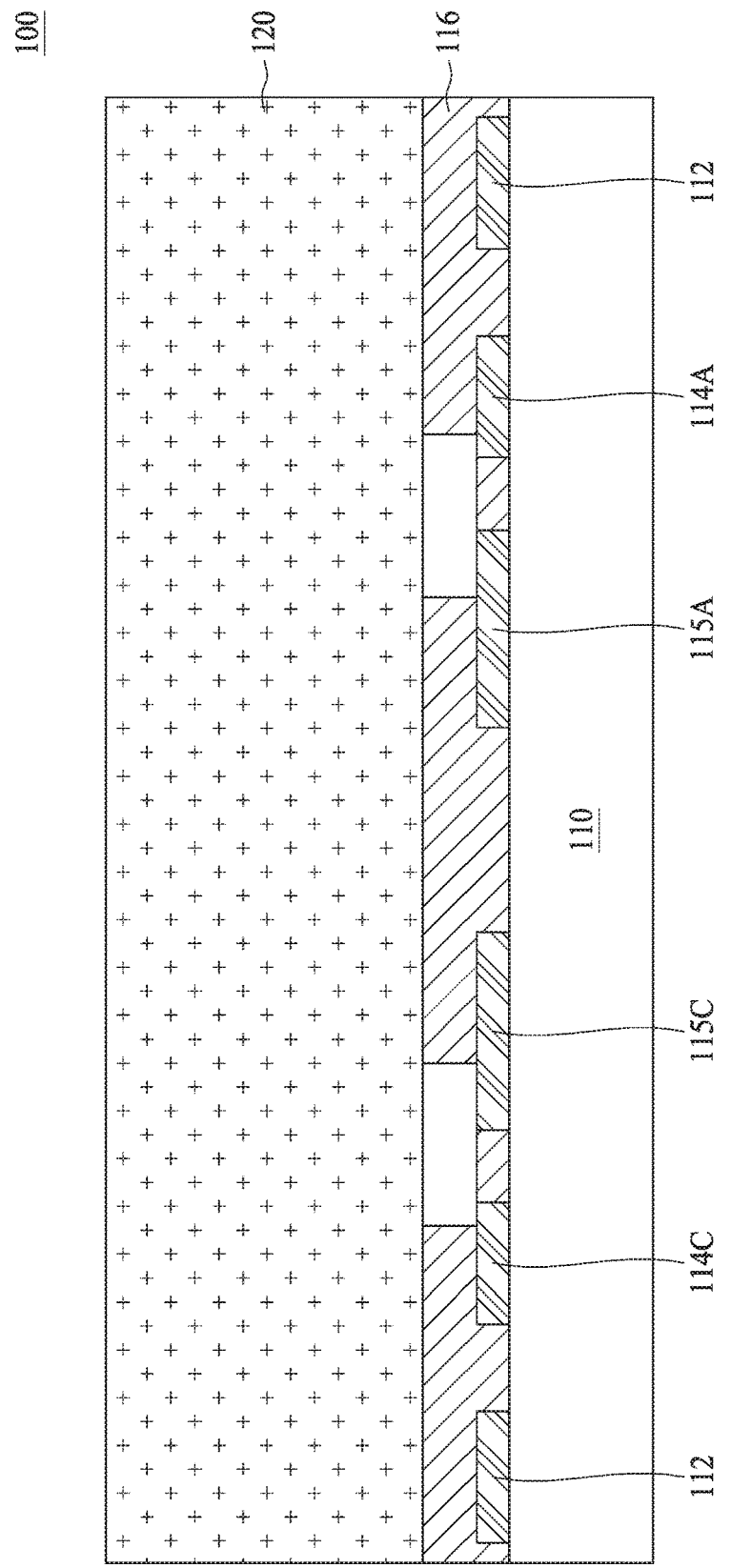

In FIG. 5B, an interface layer 116 is deposited over the first substrate 110, and over the bond pads 112, 114 and 115. The interface layer 116 may be formed by a suitable technology, such as thermal oxidation, spin coating, CVD, PECVD, atomic layer deposition (ALD), PVD, or the like. In some embodiments, an etching operation may be performed on the interface layer 116 to expose a portion of the bond pads 114 or 115. Next, in FIG. 5C, a second substrate 120 is bonded with the first substrate 110. The bonding method may include compressive bonding, fusion bonding, or solid-liquid inter-diffusion bonding (SLID). In some embodiments, a thermal annealing is involved in the bonding operation that fuses the second substrate 120 where it makes contact with the interface layer 116.

Figure 5D:
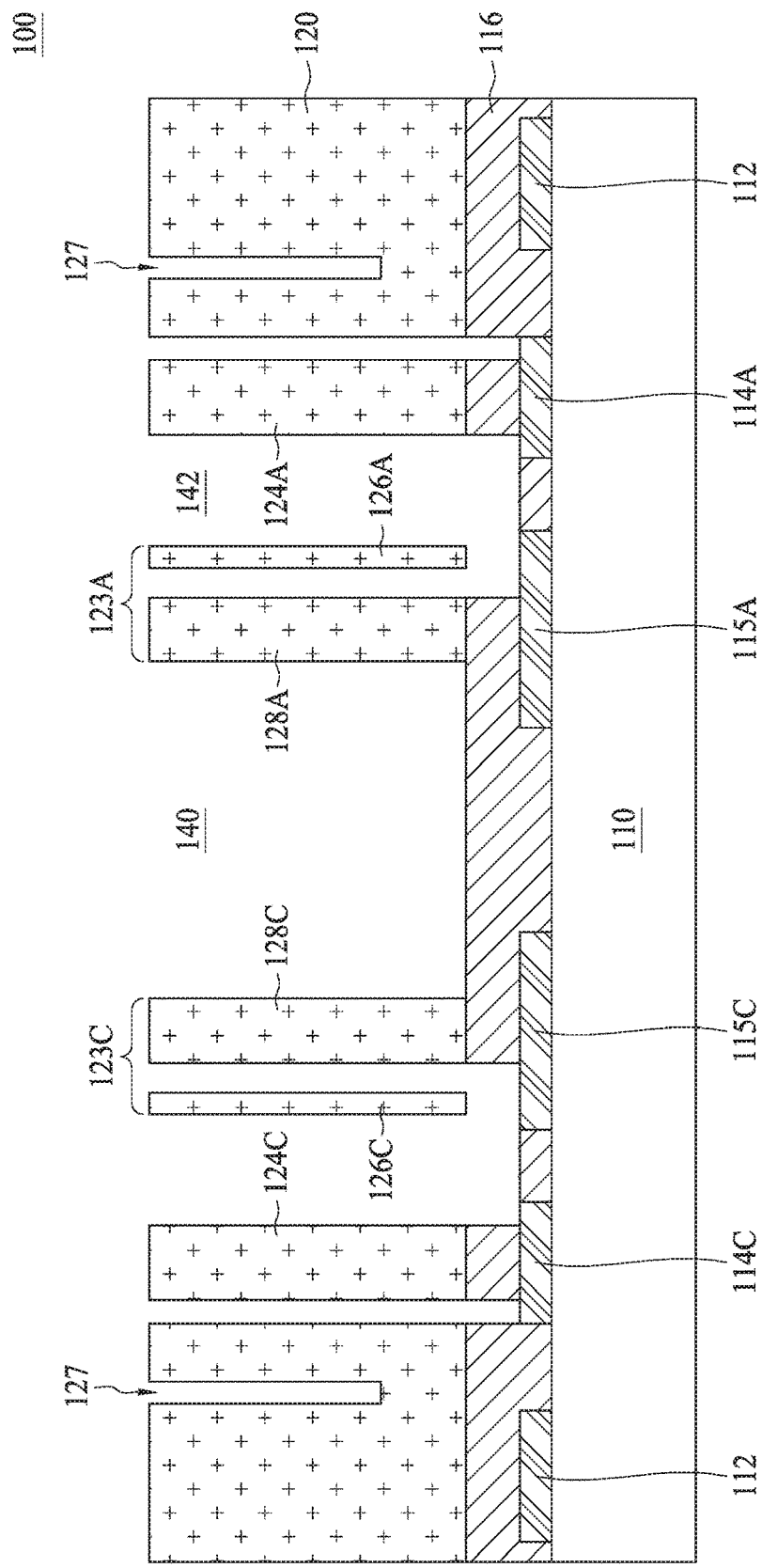
Figure 5E:
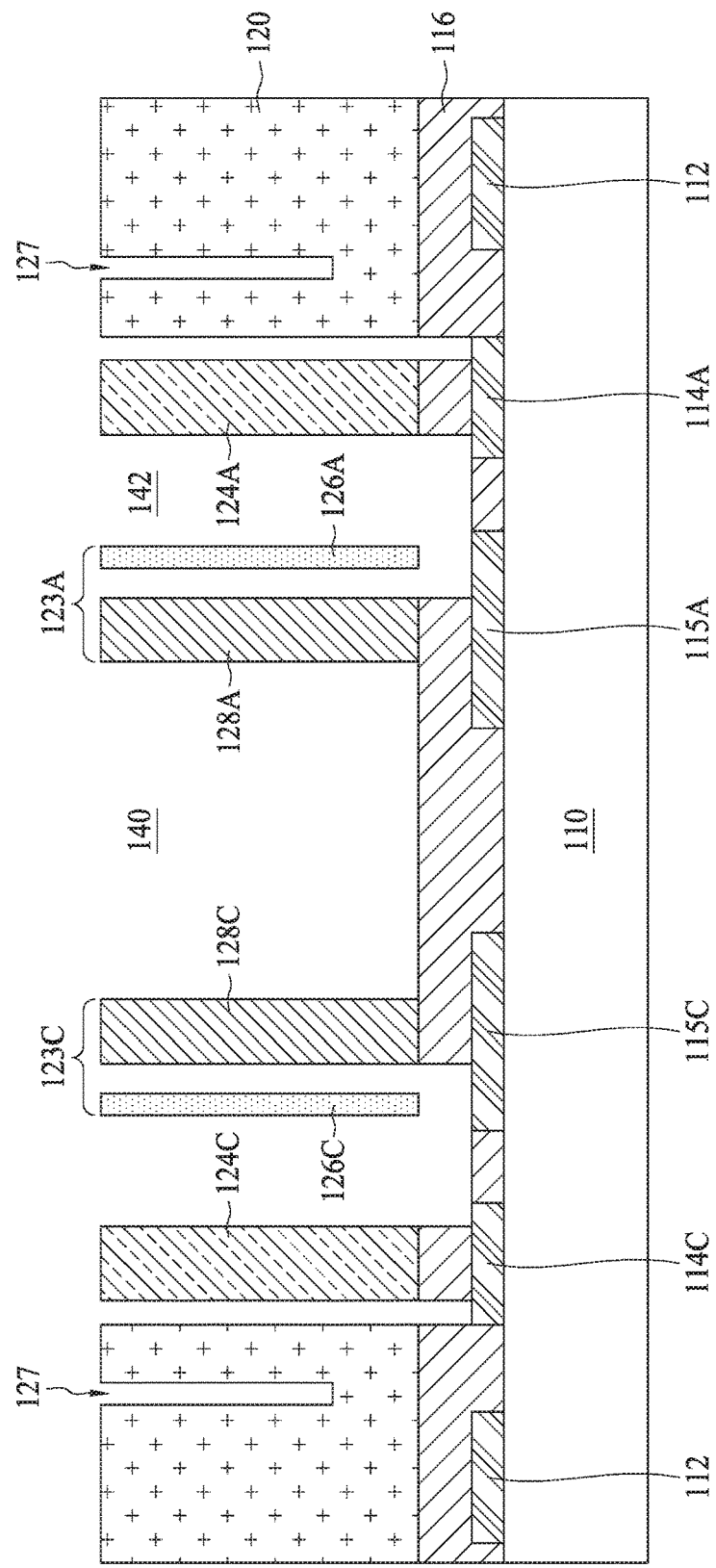

Referring to FIG. 5D, the second substrate 120 is etched to form the first electrode 123, the second electrode 124, and the trench 127. In addition, recesses are formed for constructing cavities 140 and 142. The etch operation may include a dry etching, a wet etching, an RIE operation, combinations thereof, or the like. Subsequently, as shown in FIG. 5E, doped regions are formed in the first electrode 123 (including the membrane 128 and the plate 126) and the second electrode 124. The doping operation may be performed by an ion implantation, for example. Since the first electrode 123 and the second electrode 124 are physically separated from the remaining portions of the second substrate 120 before being doped, they are electrically isolated from the second substrate 120 after being doped. In some embodiments, the doping concentration of the first electrode 123 or the second electrode 124 is between about 1E18 and 1E20 atoms/cm$^3$. In some embodiments, the doping concentration of the first electrode 123 or the second electrode 124 is between about 1E19 and 1E20 atoms/cm$^3$.

Figure 5F:
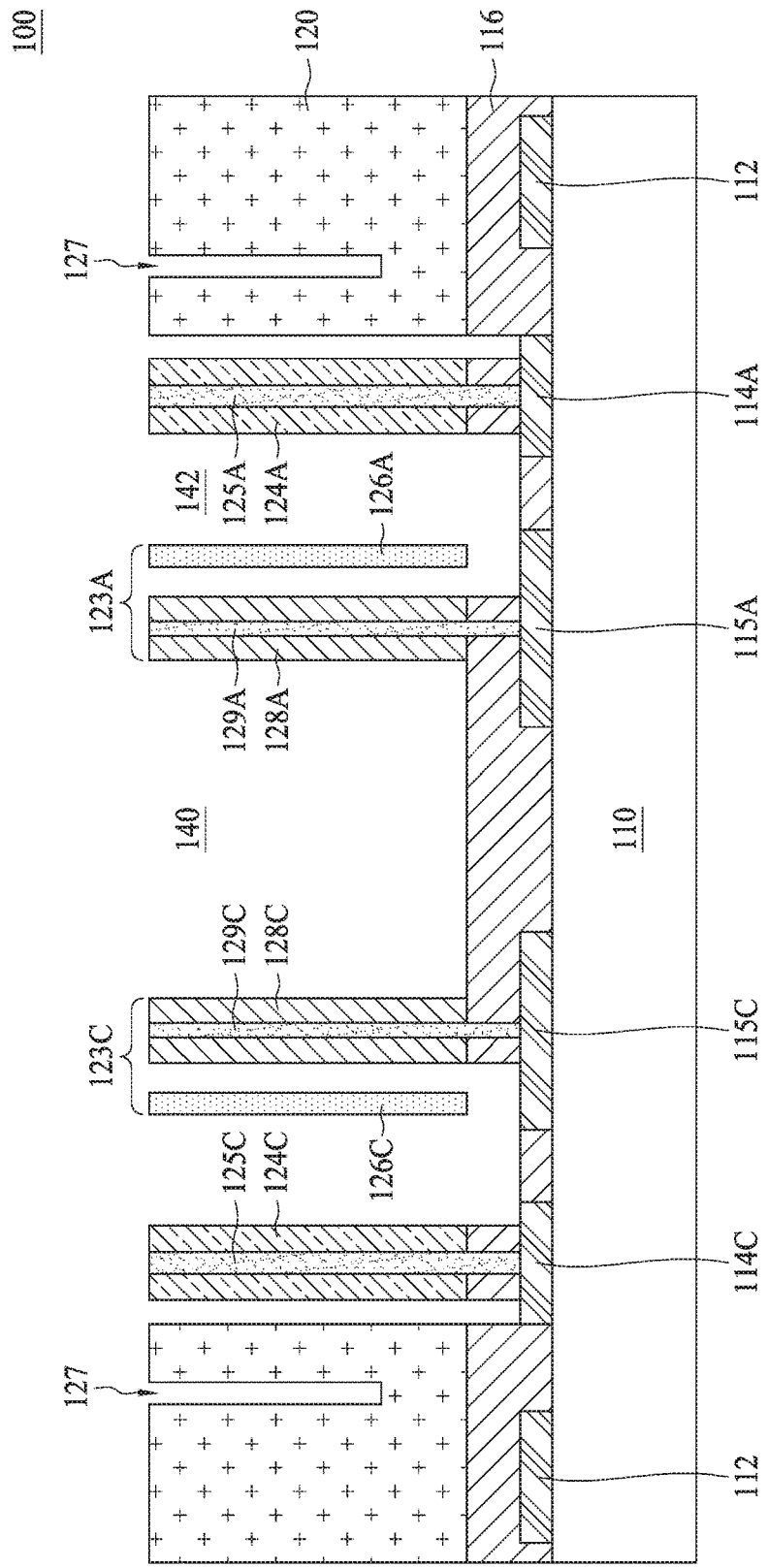

Next, as illustrated in FIG. 5F, a conductive via 129 including portions 129A and 129C is formed in the membrane 128. The conductive via 129 may be formed by initially recessing the membrane 128 from an upper surface. The resultant recesses may extend through the membrane 128 and the interface layer 116 whereby a top portion of the bond pads 115A or 115C is exposed. A conductive material is filled in the recesses by a suitable method, such as CVD, LPCVD, PECVD, sputtering, PVD, ALD, or the like. In some embodiments, a planarization operation, such as grinding or chemical mechanical polishing (CMP), may be utilized to remove excess conductive materials and level the upper surface of the conductive via 129 with the membrane 128. Furthermore, another conductive via 125, including portions 125A and 125C, is formed in the second electrode 124. In some embodiments, the conductive via 125 extends through the interface layer 116 and is electrically coupled to the bond pads 114. The material and manufacturing methods of the conductive via 125 are similar to those used for the conductive via 129. In some embodiments, the conductive via 125 is formed only in the arm 121 rather than in the fingers of the second electrode 124.

Figure 5G:
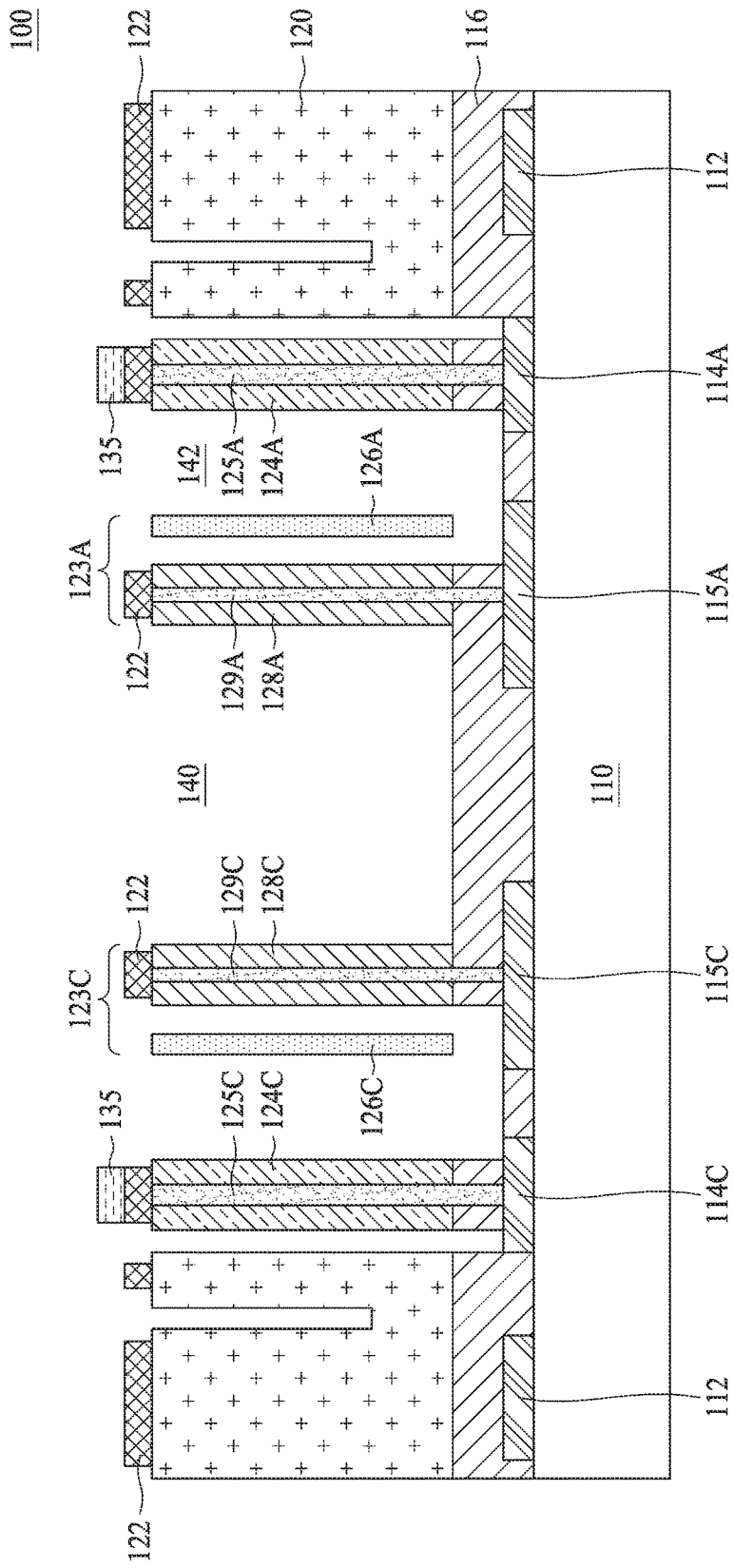
Figure 5H:
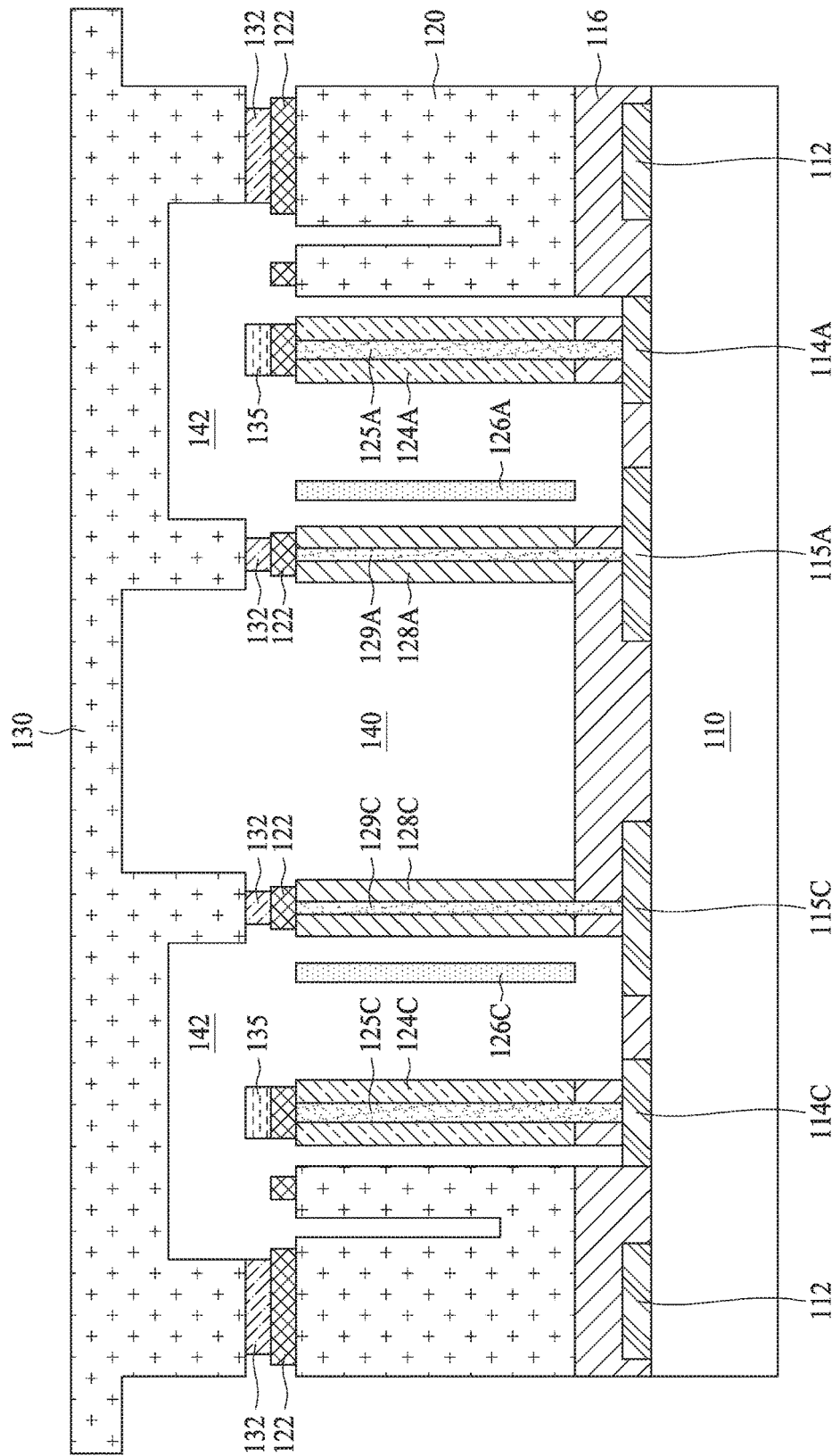
Figure 5I:
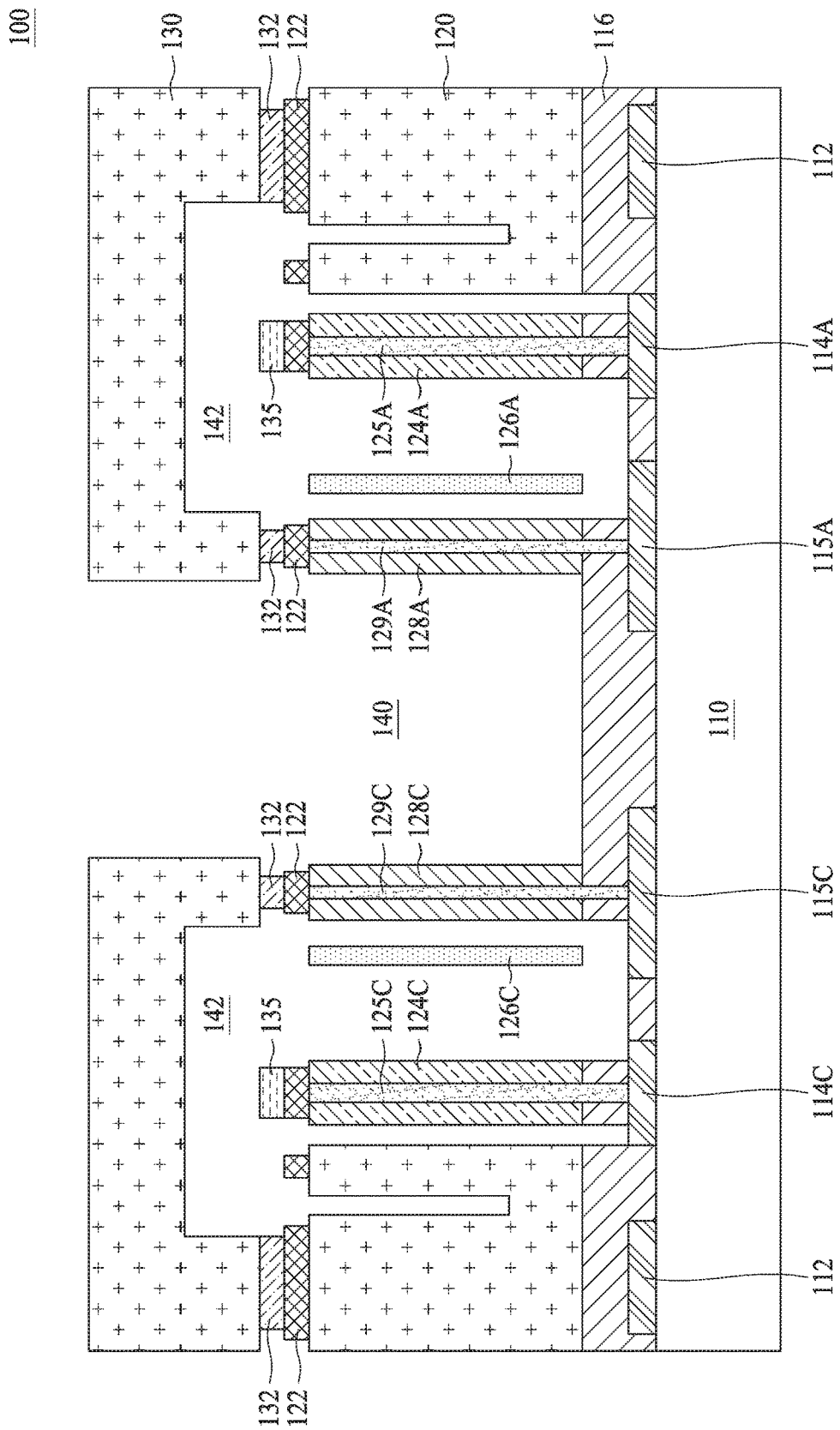

Referring to FIG. 5G, a bonding layer 122 and a protection layer 135 are sequentially formed over the second substrate 120. The formation of the bonding layer 122 and the protection layer 135 may be similar to that of the bonding layer 132 with reference to FIG. 4A. Next, as illustrated in FIG. 5H, the third substrate 130 is bonded to the second substrate 120 through the bonding layers 122 and 132. In some embodiments, the bonding operation includes eutectic bonding. At the same time, the cavities 140 and 142 are sealed through the bonding operation. In some embodiments, the bonding operation is performed under a vacuum environment such that the cavity 142 is kept substantially in a vacuum state. Subsequently, as shown in FIG. 5I, the third substrate 130 is recessed s in order to create an opening of the cavity 140. In some embodiments, the recessing of the third substrate 130 may be performed by an etch operation, such as a dry etching. The MEMS device 100 is completed accordingly.

The present disclosure provides a semiconductor device, which includes a first substrate comprising an upper surface and a second substrate disposed over the first substrate. The semiconductor device also includes a first electrode disposed in the second substrate and configured to move in a direction substantially parallel to the upper surface in response to a pressure difference, and a second electrode disposed in the second substrate. The second electrode is configured to provide a capacitance in conjunction with the first electrode.

The present disclosure provides a semiconductor device. The semiconductor device includes a first substrate, and a second substrate disposed over the first substrate. The semiconductor device also includes a first electrode disposed in the second substrate and configured to move in response to a pressure difference applying against the first electrode, and a second electrode disposed in the second substrate and laterally surrounding the first electrode.

The present disclosure provides a method of manufacturing a semiconductor device. A first substrate is bonded with a second substrate. The second substrate is recessed to form a first electrode and a second electrode. The first electrode includes a membrane and a plurality of fingers configured to shift in response to a deflection of the membrane. A first pad is formed over the second substrate. The second substrate is bonded with a third substrate thereby forming a first cavity accommodating the second electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a first substrate comprising an upper surface;
a second substrate disposed over the first substrate;
a first electrode disposed in the second substrate and configured to move in a direction substantially parallel to the upper surface; and
a second electrode disposed in the second substrate and configured to provide a capacitance in conjunction with the first electrode, wherein at least one of the first electrode and the second electrode comprises a conductive via electrically coupled to the first substrate.

2. The semiconductor device according to claim 1, further comprising a third substrate over the second substrate, wherein a first cavity is formed by the first substrate, the second substrate and the third substrate.

3. The semiconductor device according to claim 1, wherein the first electrode comprises:
a membrane configured to deflect in response to a pressure difference; and
a plurality of conductive plates configured to shift synchronously with the membrane.

4. The semiconductor device according to claim 3, wherein the membrane is perpendicular to the upper surface of the first substrate.

5. The semiconductor device according to claim 3, wherein the membrane and the first substrate form a second cavity exposed to the atmosphere.

6. The semiconductor device according to claim 3, wherein the membrane has a rectangular shape viewed from above.

7. The semiconductor device according to claim 1, further comprising an interface layer bonding the first substrate with the second substrate.

8. The semiconductor device according to claim 7, wherein the interface layer further comprises a recess facing the first electrode and the second electrode.

9. The semiconductor device according to claim 1, further comprising a bonding layer electrically bonding the second substrate with a third substrate over the second substrate.

10. The semiconductor device according to claim 1, wherein at least one of the second electrode and the first electrode has a plurality of fingers.

11. The semiconductor device according to claim 1, wherein the second electrode laterally surrounds the first electrode.

12. A semiconductor device comprising:
a first substrate;
a second substrate disposed over the first substrate;
a first electrode disposed in the second substrate and configured to move in response to a pressure difference applied against the first electrode, the first electrode comprising a conductive via electrically coupled to the first substrate; and
a second electrode disposed in the second substrate and laterally surrounding the first electrode.

13. The semiconductor device according to claim 12, wherein the second electrode is disposed in a first cavity defined by the first substrate, the second substrate and the first electrode.

14. The semiconductor device according to claim 12, further comprising a third substrate over the second substrate, wherein the first electrode defines a second cavity in conjunction with the first substrate and the third substrate.

15. A semiconductor device according to claim 14, further comprising a first pad electrically bonding the second substrate with the third substrate.

16. The semiconductor device according to claim 15, wherein the conductive via is further configured to electrically coupled with the first pad.

17. The semiconductor device according to claim 12, further comprising a bonding layer disposed over the first electrode and a protection layer covering the bonding layer.

18. A semiconductor device comprising:
a first substrate comprising an upper surface;
a second substrate over the first substrate;
an interface layer electrically bonding the first substrate with the second substrate;
a first electrode disposed over the first substrate, the first electrode comprising a membrane and a first plurality of fingers; and
a second electrode disposed over the first substrate and spaced apart from the first electrode.

19. The semiconductor device according to claim 18, wherein the second electrode comprises a second plurality of fingers staggered with the first plurality of fingers.

20. The semiconductor device according to claim 18, wherein the second substrate laterally surrounds the first electrode and the second electrode.

* * * * *